US012615730B2

(12) United States Patent
O'Donnell et al.

(10) Patent No.: US 12,615,730 B2
(45) Date of Patent: Apr. 28, 2026

(54) SINGLE PIECE STRUCTURAL MEMBERS FOR SECURITY BEZELS

(71) Applicant: Dell Products L.P., Round Rock, TX (US)

(72) Inventors: Sean P. O'Donnell, Poughkeepsie, NY (US); Nicholas Lenn Poteracki, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 84 days.

(21) Appl. No.: 18/496,205

(22) Filed: Oct. 27, 2023

(65) Prior Publication Data

US 2025/0142755 A1      May 1, 2025

(51) Int. Cl.
*H05K 7/14* (2006.01)

(52) U.S. Cl.
CPC ......... *H05K 7/1402* (2013.01); *H05K 7/1495* (2013.01)

(58) Field of Classification Search
None
See application file for complete search history.

(56) References Cited

U.S. PATENT DOCUMENTS

| | | | | |
|---|---|---|---|---|
| 7,002,799 | B2 | 2/2006 | Malone et al. | |
| 7,684,213 | B2 * | 3/2010 | Titus .................... | H05K 7/1487 |
| | | | | 361/818 |
| 8,941,993 | B2 | 1/2015 | Eckberg et al. | |
| 10,324,503 | B1 * | 6/2019 | O'Donnell ........... | H05K 9/0062 |
| D891,436 | S * | 7/2020 | Gundogan ................... | D14/441 |
| 11,334,125 | B1 | 5/2022 | Crisp | |
| 11,525,590 | B2 * | 12/2022 | Chen ................... | H05K 7/20145 |
| 11,723,167 | B2 | 8/2023 | Chen | |
| 2015/0062796 | A1 * | 3/2015 | Yu ......................... | H05K 5/0221 |
| | | | | 49/460 |
| 2020/0030734 | A1 | 1/2020 | Hara | |
| 2020/0333856 | A1 | 10/2020 | Quijano | |
| 2023/0116870 | A1 * | 4/2023 | Doglio ................. | H05K 9/0041 |
| | | | | 361/679.46 |
| 2023/0128507 | A1 * | 4/2023 | Clark .................... | E05B 65/006 |
| 2023/0129135 | A1 | 4/2023 | Clark | |
| 2023/0199994 | A1 | 6/2023 | Chen | |

* cited by examiner

*Primary Examiner* — Allen L Parker
*Assistant Examiner* — Christopher L Augustin
(74) *Attorney, Agent, or Firm* — WOMBLE BOND DICKINSON (US) LLP

(57) ABSTRACT

Methods, systems, and devices for providing computer implemented services are disclosed. To provide the computer implemented services, a data processing system may include various hardware components. To secure the various hardware components, the data processing system may include a security bezel. The security bezel may have a structure that includes structural members that form a partial covering for a two-dimensional surface. A structural member of the structural members may be adapted to span a distance between two points of the surface and resist deformation due to force applied to the structural member. The structural member may also include a portion of a sheet of material that is folded so that two sub-portions of the portion of the sheet of material are in different planes that intersect along a line.

20 Claims, 10 Drawing Sheets

Chassis 106

Power/Thermal Components 104

Electronics 102

Data Processing System 100

Data Processing System 100

Power/Thermal Components 104

Chassis 106

Security Bezel 108

Structural
Member 202A

Intersection Line
208

Sub-portion 206A

Sub-portion 206B

Plane 210A

Plane 210B

Security Bezel 200

Sub-portion 206A

Intersection Line 208

Sub-portion 206B

Boundary 212

Structural Member 202C

Structural Member 202E

Structural Member 202D

Boundary 214

SINGLE PIECE STRUCTURAL MEMBERS FOR SECURITY BEZELS

FIELD

Embodiments disclosed herein relate generally to device management. More particularly, embodiments disclosed herein relate to managing security of devices.

BACKGROUND

Computing devices may provide computer-implemented services. The computer-implemented services may be used by users of the computing devices and/or devices operably connected to the computing devices. The computer-implemented services may be performed with hardware components such as processors, memory modules, storage devices, and communication devices. The operation of these components may impact the performance of the computer-implemented services.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1A:
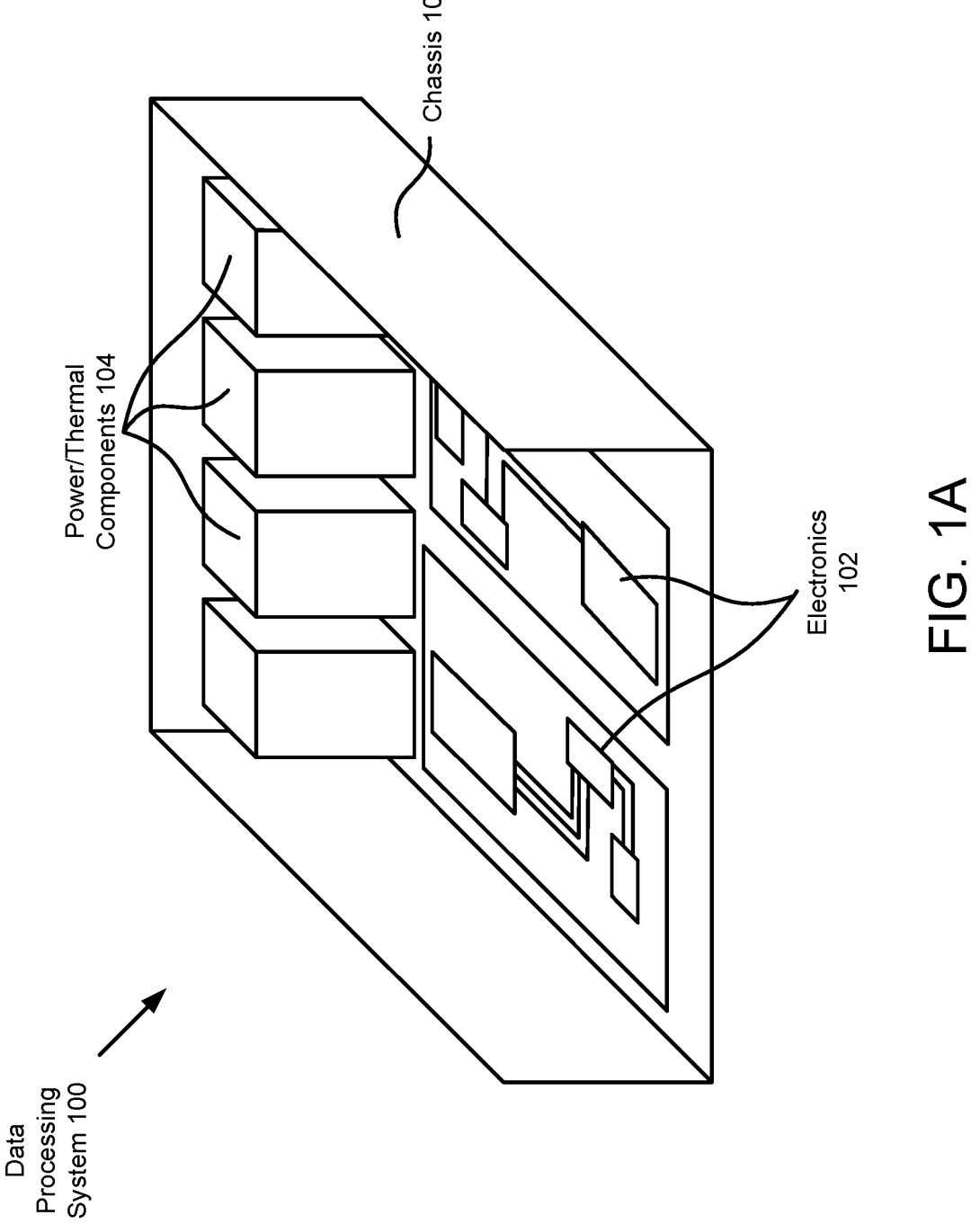
FIGS. 1A-1B show block diagrams illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments disclosed herein relate to methods and systems for providing, at least in part, computer implemented services. To provide the services, a system may include any number of hardware components (e.g., storage devices, memory modules, processors, etc.). To facilitate placement and management of the hardware components, the hardware components may be positioned in a chassis. For example, the chassis may be a form factor compliant (e.g., a ½U sled) enclosure. The enclosure, to provide its functionality, may include an opening through which access to the hardware components is provided. For example, this access may facilitate insertion and/or removal of hot swap components and may facilitate airflow into and/or out of the enclosure.

Consequently, access to the hardware components provided by the opening may leave the hardware components vulnerable to compromise (e.g., due to theft and/or damage of the hardware components). If damaged, the hardware components may be prevented from providing various functionalities (on which the computer implemented services depend) as intended. Additionally, for example, the hardware components may be stolen using the access. Once removed, the stolen hardware components would not be capable of providing the various functionalities on which the computer implemented services depend. Thus, the vulnerability provided by the access may increase a likelihood of compromise of the computer implemented services.

To decrease the likelihood of compromise of the hardware components, the data processing system may include a security bezel to limit access to the hardware components. To do so, security bezel may be implemented as a structure with homogenous composition (e.g., the structure may be made entirely of sheet metal). The structure may include structural members to resist forces applied to the security bezel, and holes to facilitate the traversal of gases for thermal regulation of the hardware components.

This structure may be positioned on a two-dimensional surface that spans a distance across the opening of the enclosure. By doing so, security bezel 108 may limit access to the hardware components within the interior of the enclosure.

In an embodiment, a security bezel for a chassis of a data processing system is provided.

The security bezel may include a structure for securing access to an interior of the chassis, the structure may include structural members that form a partial covering for a two dimensional surface, the structural members may include a structural member that is adapted to span a distance between two points on the surface; resist deformation due to force applied to the structural member; and may include a portion of a sheet of material that is folded so that two sub-portions of the portion of the sheet of material are in different planes that intersect along a line; and holes through the structure, the holes may include a hole that is at least partially bounded by the structural member.

The hole may have a size adapted to prevent intrusion into the interior through the surface.

The size may be further adapted to facilitate movement of objects below a size threshold through the surface.

At least a portion of the holes may be arranged in a honeycomb pattern.

The holes may include a second hole that is at least partially bounded by a second structural member of the structural members, wherein the second structural member is a second type of structural member, and the structural member is a first type of structural member.

The second structural member may include a second portion of the sheet of material that is smaller than the portion of the sheet of material.

The second portion of the sheet of material and the first sub-portion of the portion of the sheet of material may be substantially a same size.

The sheet of material may be sheet metal.

The portion of the sheet of material may be defined by four boundaries, two of the four boundaries connect the portion of the sheet of material to other portions of the sheet of material, and a remaining two of the four boundaries are unconnected to any portions of the sheet of material.

A first sub-portion of the sub-portions may be defined by four additional boundaries, two of the four additional boundaries connect the first sub-portion to the other portions, one of the four additional boundaries connects the first sub-portion to a second sub-portion of the sub-portions, and a remaining one of the four additional boundaries are unconnected to any portions of the sheet of material and any of the sub-portions.

In an embodiment, a data processing system is provided that may include the security bezel as discussed above.

In an embodiment, an enclosure that may include the security bezel as discussed above is provided.

Turning to FIG. 1A, a diagram illustrating a data processing system in accordance with an embodiment is shown. The data processing system shown in FIG. 1A may provide computer implemented services. The computer implemented services may include any type and/or quantity of computer implemented services. For example, the computer implemented services may include data storage services, instant messaging services, database services, and/or any other type of service that may be implemented with a computing device.

To provide the computer implemented services, the data processing system may include various hardware components. These hardware components may facilitate various functionalities of a data processing system (e.g., 100). For example, to provide the computer implemented services, data processing system 100 may include electronics 102, power/thermal components 104, and chassis 106. Each of these is discussed below.

Electronics 102 may include various types of hardware components such as processors, memory modules, storage devices, communications devices, and/or other types of devices. Any of these hardware components may be operably connected to one another using circuit card traces, cabling, connectors, etc. that establish electrical connections used to transmit information between the hardware components.

Power/thermal components 104 may power any of the components of data processing system 100 and/or thermally manage any of the components of data processing system 100. For example, power/thermal components 104 may include power supplies, fans, and/or other types of devices usable to power and/or thermally manage the components.

Any of the components of data processing system 100 may be positioned in chassis 106. Chassis 106 may include an enclosure in which physical structures of electronics 102 (e.g., processors, memory, etc.) and power/thermal components 104 (e.g., power supplies, fans, etc.) may be positioned. Chassis 106 may facilitate placement and management of electronics 102 and/or other components in a computing environment.

To facilitate the placement and management, the enclosure may include an opening (e.g., on a front side and/or a back side of chassis 106) through which access to the hardware components of data processing system 100 is provided. For example, this access may facilitate insertion and/or removal of hot swap components for chassis 106.

Additionally, the opening may facilitate airflow into and/or out of chassis 106, thereby providing additional thermal management (e.g., cooling) for data processing system 100.

To provide its functionality, chassis 106 may be implemented with a form factor compliant (e.g., a ½U sled) enclosure usable to integrate data processing system 100 into a high-density computing environment, such as a rack mount chassis management system.

Consequently, access to the hardware components provided by the opening may leave data processing system 100 vulnerable to compromise (e.g., due to theft and/or damage of the hardware components). For example, a negligent and/or an incompetent individual may interact with the hardware components using the access, resulting in bent contact pins, ruptured liquid cooling tubes, and/or other physical damages caused by the individual. If damaged, the hardware components may be prevented from providing various functionalities (on which the computer implemented services depend) as intended.

Additionally, for example, the hardware components may be stolen from chassis 106 using the access. Once removed, the stolen hardware components would not be available to data processing system 100, and therefore, would not be capable of providing the various functionalities on which the computer implemented services depend.

Thus, the vulnerability provided by the access may increase a likelihood of compromise of the computer implemented services.

In general, embodiments disclosed herein relate to systems, methods, and devices for managing security of a data processing system. More particularly, embodiments disclosed herein may relate to security management of hardware components of a data processing system. The security of the hardware components may be managed to decrease a likelihood of compromise caused by access to the hardware components. To do so, the data processing system (e.g., 100) may include a security bezel as seen in FIG. 1B (discussed below).

While illustrated in FIG. 1A with a limited number of specific components, a data processing system may include additional, fewer, and/or different components without departing from embodiments disclosed herein.

Figure 1B:
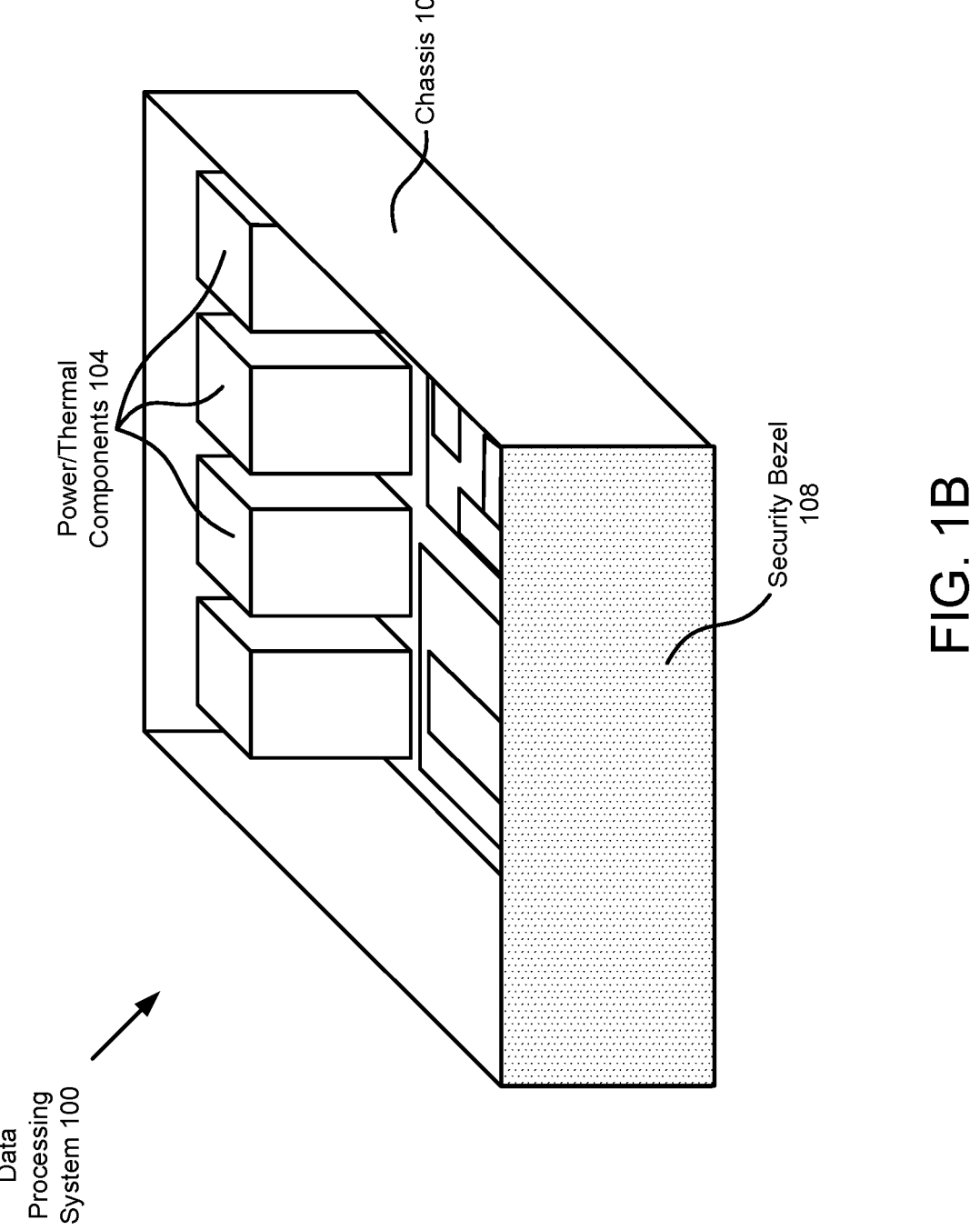

Turning to FIG. 1B, a diagram illustrating data processing system 100 in accordance with an embodiment is shown. As previously discussed, data processing system 100 may provide computer implemented services. To do so, data processing system 100 may include various hardware components that provide various functionalities on which the computer implemented services depend. However, access to the hardware components, provided by an opening in chassis 106, may leave data processing system 100 vulnerable to compromise, thereby increasing a likelihood of compromise to the computer implemented services. To decrease the likelihood of compromise caused by the access, data processing system 100 may include security bezel 108, as shown in FIG. 1B.

Security bezel 108 may prevent access to the hardware components positioned within an interior of chassis 106. To do so, security bezel 108 may (i) be implemented as a structure with homogenous composition (e.g., the structure may be made entirely of sheet metal), and (ii) be positioned on a two-dimensional surface that spans a distance across the opening of chassis 106, discussed previously. By doing so, security bezel 108 may limit access to the hardware components within the interior of chassis 106 (e.g., within data processing system 100).

To provide its functionality, security bezel 108 may include (i) structural members and (ii) holes, each of which may inhibit entities and/or forces from interacting with the interior of chassis 106 from an exterior of chassis 106 while allowing for flows of gasses to travers into chassis 106 for cooling purposes. To do so, the structural members may resist deformation when force is applied to the structural members, and the holes may be within a size threshold that prevents intrusion (e.g., by one of the entities) into the interior through the surface. For additional information regarding the structural members and/or the holes, refer to FIGS. 2A-2D.

Additionally, security bezel 108 may be shaped from a sheet of metal. The resulting shaped sheet of metal may include the structural members, discussed above, that impart physical strength to the security bezel. By being shaped from a sheet of metal, the resulting security bezel may be more easily recycled, and less energy intensive to manufacture when compared to manufacturing of other types of structural members.

While illustrated in FIG. 1B with a limited number of specific components, a system may include additional, fewer, and/or different components without departing from embodiments disclosed herein.

As noted above, a security bezel may be used to secure hardware components in a chassis. FIGS. 2A-2D show diagrams illustrating examples of security bezels in accordance with an embodiment.

Figure 2A:
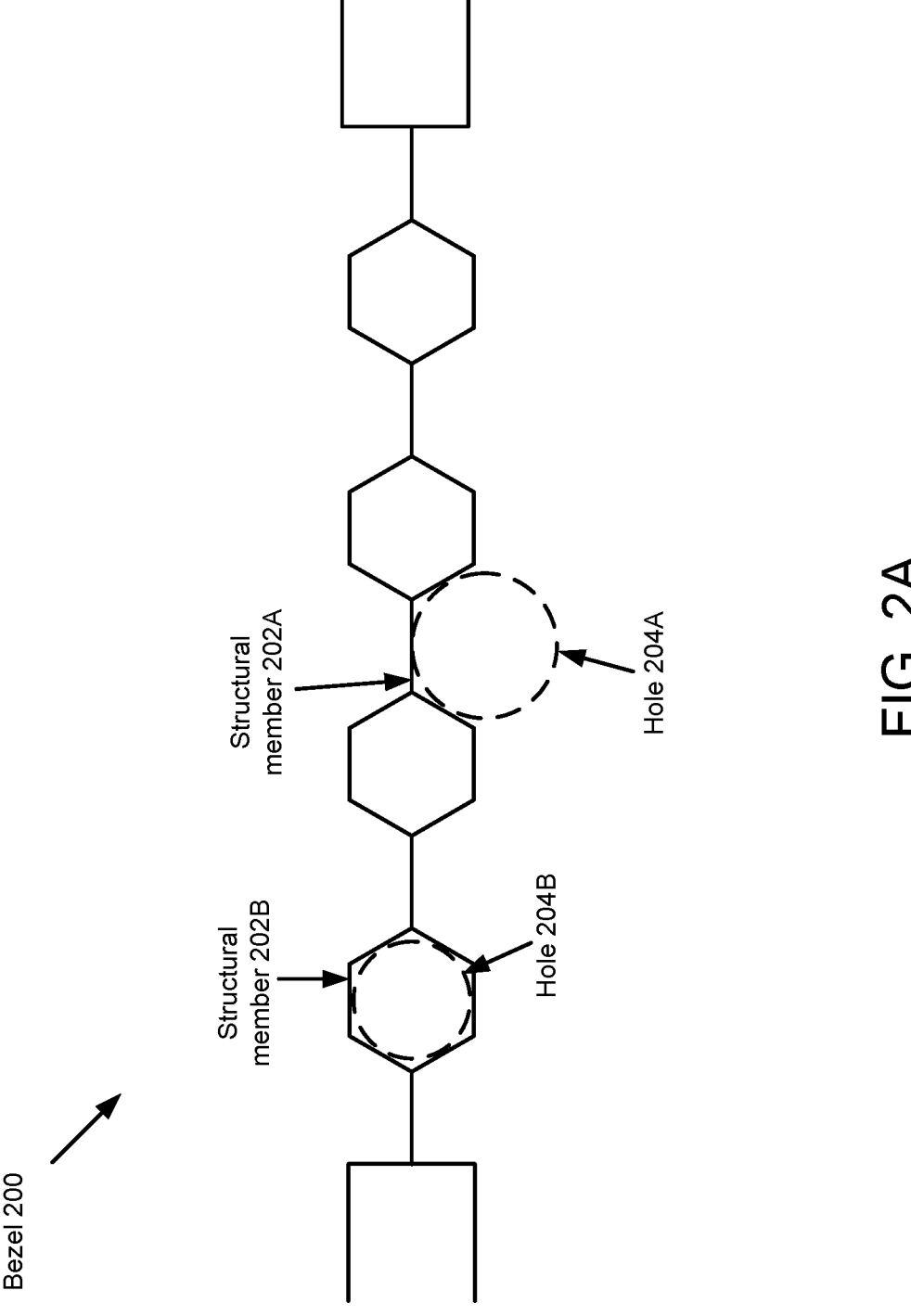
FIG. 2A shows a diagram illustrating a security bezel in accordance with an embodiment.

Turning to FIG. 2A, a first diagram illustrating a security bezel (e.g., 200) in accordance with an embodiment is shown. It will be appreciated that security bezel 200 may be a same security bezel as that discussed with regard to FIG. 1B (e.g., 108). In FIG. 2A, the viewpoint may be from a front of security bezel 200 rather than from a perspective view as shown in FIG. 1B. As discussed above, security bezel 200 may facilitate security management for various hardware components of data processing system 100 by preventing access to the hardware components.

To prevent access to the hardware components, security bezel 200 may be implemented using a rigid, self-supporting structure. The security bezel 200 may screen access to an interior of a chassis (e.g., 106) while enabling airflow into and/or out the chassis.

To provide its functionality, security bezel 200 may include structural members (e.g., 202A-202B) and holes (e.g., 204A-204B). Each of these is discussed below.

The structural members may be arranged to partially cover a surface and form a self-supporting super structure. The structural members may bound the holes through which gases may traverse. The holes may have shapes and sizes that prevent general physical access to an interior of the chassis.

Each structural member of the structural members may (i) span a distance between two points on the surface (e.g., the two-dimensional surface discussed with regard to FIG. 1B) and (ii) resist deformation due to force applied to any number of the structural members. Furthermore, each structural member may be of (i) a first type of structural member or (ii) a second type of structural member. For example, structural member 202A may be of the first type while structural member 202B may be of the second type. Each of these is discussed below.

Figure 2B:
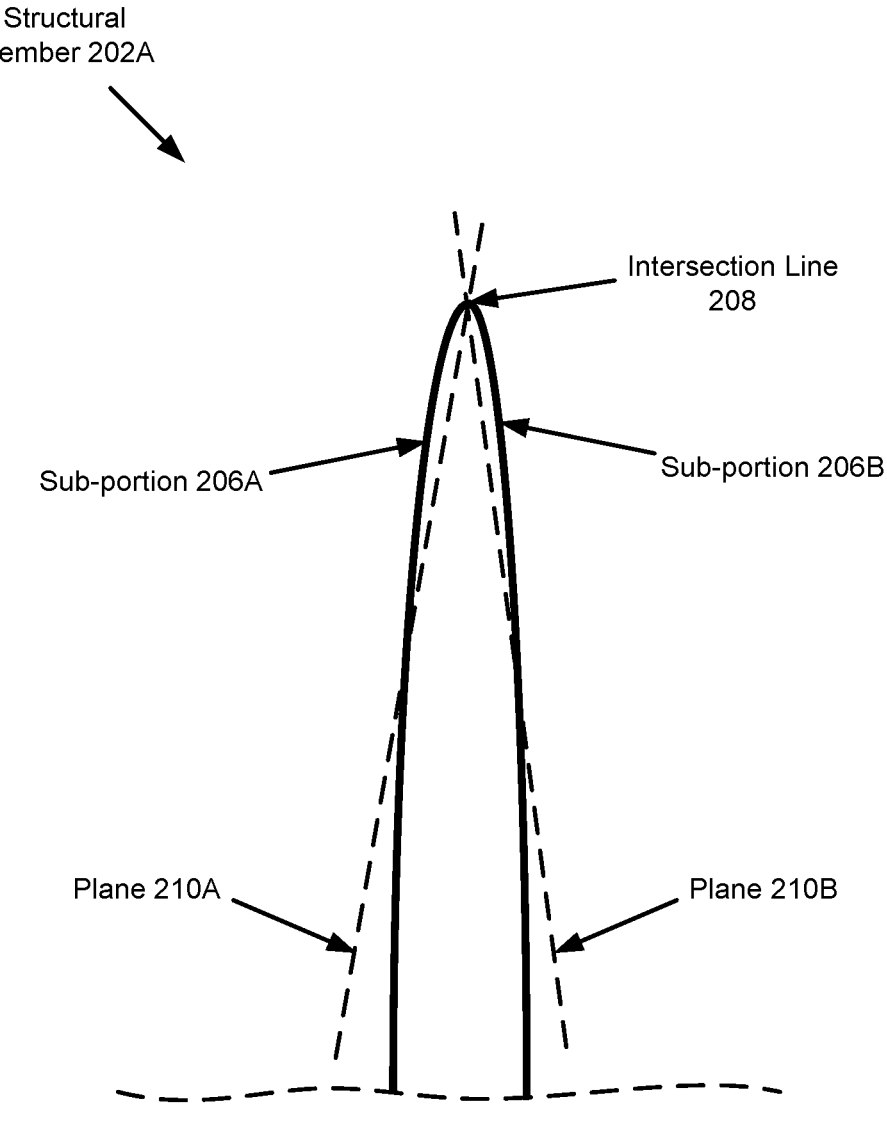
FIG. 2B shows a diagram illustrating a structural member in accordance with an embodiment.

Structural members of the first type (e.g., structural member 202A) may have a first cross-sectional shape, refer to FIG. 2B for additional detail regarding the first cross-sectional shape.

Structural member 202A may include a first portion of a sheet of material (e.g., a portion of the structure with homogenous composition discussed with regard to FIG. 1B). This first portion may be folded so that sub-portions (e.g., a first sub-portion and a second sub-portion) of the first portion are substantially aligned with different planes that intersect along a line. Additionally, each of the sub-portions may be substantially of a same size. For additional information regarding the sub-portions, refer to FIG. 2B.

Structural members of the second type may have a second cross-sectional shape. The second cross-sectional shape may be a rectangle that is, for example, short and wide (e.g., the cross section of a plate).

Structural member 202B may include a second portion of the sheet of material that is not folded, and thus, is substantially aligned with a single plane. Additionally, the second portion may be of a smaller size than the first portion, but substantially of a same size as the first (or the second) sub-portion.

As used herein, the term substantially of the same size means that two different things are intended to be a of a same size but may be of different sizes due to variations in manufacturing and/or other types of real-world challenges in fabrication. For additional information regarding fabrication of security bezel 200, refer to FIGS. 2D-2G.

As previously mentioned, the structural members may bound the holes through which gases may traverse. More particularly, each hole of the holes may be at least partially bound by a portion of the structural members.

For example, and similar to the structural members, each hole may be of (i) a first type of hole or (ii) a second type of hole. The first type of hole (e.g., hole 204A) may be partially bound by a portion of structural members while the second type of hole (e.g., hole 204B) may be entirely bound by a portion of the structural members. These boundaries (facilitated by the structural members) may result in an arrangement of at least a portion of the holes into an at least partial honeycomb pattern (discussed further below). While described with respect to a honeycomb pattern, it will be appreciated that the holes may take on other patterns without departing from embodiments disclosed herein.

Additionally, and as previously mentioned, the holes may have shapes and sizes that prevent general physical access to an interior of the chassis. Thus, entities and/or forces may be inhibited from interacting with the hardware components from an exterior of the chassis. However, the holes may facilitate movement of objects (e.g., specialized tools) below a size threshold through the surface while preventing components within the chassis from being removed through the holes.

It will be appreciated that although security bezel 200 is illustrated as having a partial honeycomb pattern (referred to as a "first pattern") in FIG. 2A, security bezel 200 may be fabricated to have a complete honeycomb pattern (e.g., a pattern that includes more than one partial honeycomb pattern). For example, security bezel 200 may be fabricated to include the first pattern and a second pattern that is similar to the first pattern. The first pattern and the second pattern may be physically connected to one another, and the second pattern may be positioned above or below the first pattern (from the viewpoint of FIG. 2A). By fabricating security bezel 200 to include any number of partial honeycomb patterns positioned above or below the first pattern, security bezel 200 may be fabricated to have a complete honeycomb pattern.

As noted above, a security bezel may include a first type of structural member that may have a first cross-sectional shape. FIG. 2B shows a diagram illustrating the first cross-sectional shape in accordance with an embodiment.

Turning to FIG. 2B, a diagram illustrating a first type of structural member (e.g., 202A) in accordance with an embodiment is shown. In FIG. 2B, the viewpoint may be from a cross-section of structural member 202A rather than from a front view of security bezel 200 as shown in FIG. 2A.

As discussed above, structural member 202A may have a first cross-sectional shape that is different to a second cross-sectional shape of structural member 202B.

The first cross-sectional shape may be adapted (i) to impart resistance to deformation of the structural member when positioned on a chassis, (ii) for efficient fabrication, and (iii) to facilitate future reuse/recycling of the structural member. To do so, structural member 202A may generally have a cross section formed from a bent sheet of metal. The bent sheet of metal may enable structural member 202A to span a distance (e.g., into/out of the page) and resist deformation when force is applied (e.g., downward from a top of the page) to the structural member as it spans the distance. Additionally, by being formed from a bent and/or otherwise shaped sheet, structural member 202A may be formed from a material that may be recycled using a single process, without need to divide structural member 202A into different portions to be processed using different process for recycling purposes.

For example, structural member 202A may include (e.g., be formed using) a first portion of a sheet of material, and structural member 202B may include (e.g., be formed using) a second portion of the sheet of material. The first portion may (i) be folded and/or otherwise shaped (e.g., by drawing, puncturing, and/or other non-subtractive techniques), and (ii) include sub-portions 206A-206B (discussed below) generally divided based on how the portion is folded. In contrast, the second portion may (i) not be folded and (ii) not include any sub-portions.

As shown in FIG. 2B, the first portion may be folded, for example, along intersection line 208. By folding the first portion, (i) sub-portion 206A may become substantially aligned with plane 210A and (ii) sub-portion 206B may become substantially aligned with plane 210B. Planes 210A-210B may intersect along intersection line 208 (e.g., into/out of the page). The respective sub-portions may form sheets that may be substantially aligned top to bottom on the page, thereby causing structural member 202A to resist deformation due to forces applied to it from the top side and bottom side of the page.

In contrast to the cross section shown in FIG. 2B, the second cross-section of structural member 202B may be that of a cross section of a single sheet of material. For example, the second cross-section may have a shape that may be depicted as a rectangle that is short and wide (e.g., the cross section of a plate).

Thus, structural member 202A (and therefore, any structural member of the first type) and structural member 202B (and therefore, any structural member of the second type) may have different shapes to one another (e.g., the first shape and the second shape are different from one another). The use of these shapes may facilitate fabrication of these different types of structural members through non-subtractive processes, as will be described in greater detail with respect to FIGS. 2C-2D.

Figure 2C:
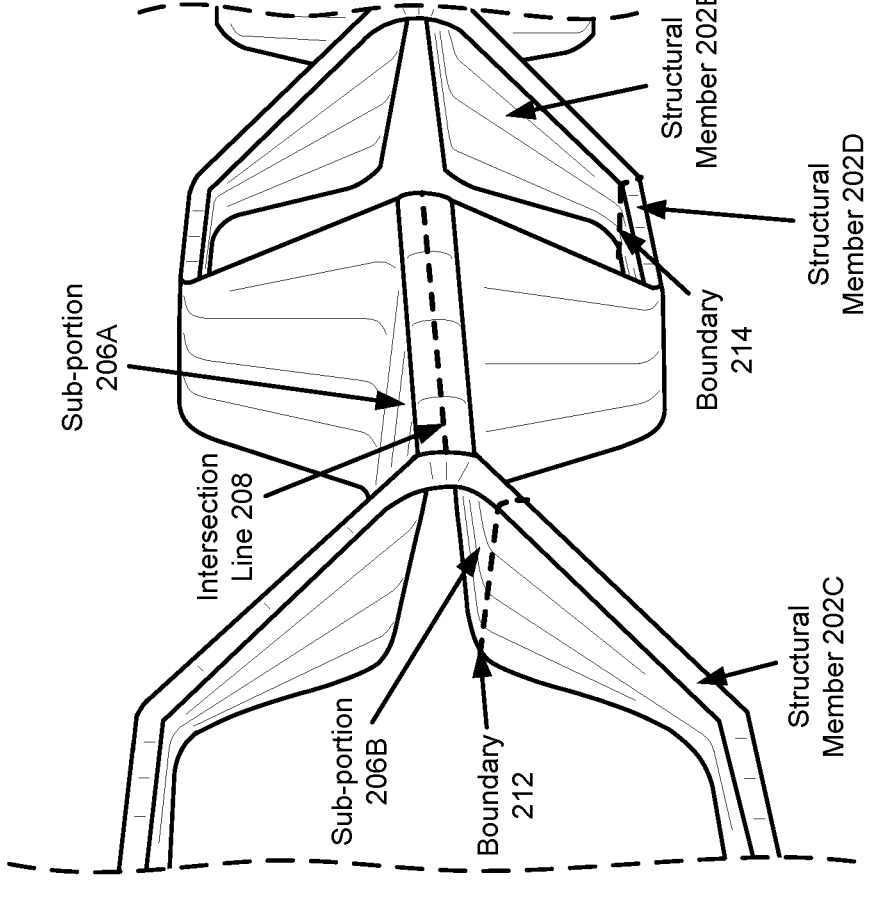
FIG. 2C shows a diagram illustrating a security bezel in accordance with an embodiment.

As noted above, a security bezel may have a structure adapted to prevent compromise of a data processing system. FIG. 2C shows a diagram illustrating an example security bezel in accordance with an embodiment.

Turning to FIG. 2C, a second diagram illustrating a security bezel (e.g., 200) in accordance with an embodiment is shown. In FIG. 2C, the viewpoint may be of a portion of security bezel 200 from an asymmetric front view rather than from a symmetric front view of security bezel 200 as shown in FIG. 2A.

As previously discussed, security bezel 200 may prevent access to hardware components in a data processing system (e.g., 100). To do so, security bezel 200 may have a structure that is (i) positioned over a surface of a chassis (e.g., 106) such as an opening that provides access to the hardware components, and (ii) adapted to resist deformation from a force applied to security bezel 200.

To provide its functionality the structure of security bezel 200 may be formed from a sheet of material. This sheet of material may be of a homogenous composition and have (along with a length and a width) a substantially uniform thickness throughout its entirety. For example, the sheet of material may be implemented with a rectangular piece of sheet metal. However, sheet metal may be easily manipulated, and consequently, may be susceptible to the deformation. Therefore, to resist the deformation, the rectangular piece of sheet metal may be modified as discussed below.

To adapt the sheet of material to resist deformation, the sheet of material may be bent, perforated, and/or otherwise shaped to form various structural members (e.g., 202C-202E). These structural members may include, for example, various planar sheets arranged to resist deformation in various planes. By arranging these sheets with respect to one another (e.g., by bending portions of the sheet of material), the resulting structure may resist deformation when forces are applied, for example, from a front side where a person may be positioned. This resistance may be due to the forces being applied to edges of the sheets, where the sheets provide a large amount of resistance when compared to applying a force to any flat face of the sheets.

The sheets may be connected to one another along various joints. The sheets and joints may form a lattice or other arrangement. For example, sub-portion 206A may be aligned with a first plane and may be connected to sub-portion 206B via a first joint aligned with intersection line 208. Additionally, sub-portion 206B may be aligned with a second plane and may be connected to structural member 202C via a second joint aligned with boundary 212, structural member 202C being aligned with a third plane.

Other portions of security bezel 200 may be formed from similar sheets connected to other sheets via similar joints. For example, structural member 202D may be aligned with a fourth plane and may be connected to structural member 202E via a third joint aligned with boundary 214, structural member 202E being aligned with a fifth plane.

By manipulating the sheet of material to form the structural members, planar sheets as the structural members may be arranged to resist forces from the front side of security bezel 200 due to the forces being applied to the edges of the sheets. Thus, the arrangement may result in the structure being adapted to prevent compromise of the data processing system by resisting forces applied to the bezel covering the opening in the chassis, while still enabling airflow through the bezel.

As previously noted, a security bezel may be fabricated using a sheet of material. FIGS. 2D-2G show examples of a security bezel at various phases of fabrication in accordance with an embodiment. Additionally, the sheet of material is illustrated with an infill pattern to better illustrate various phases of the fabrication.

Figure 2D:
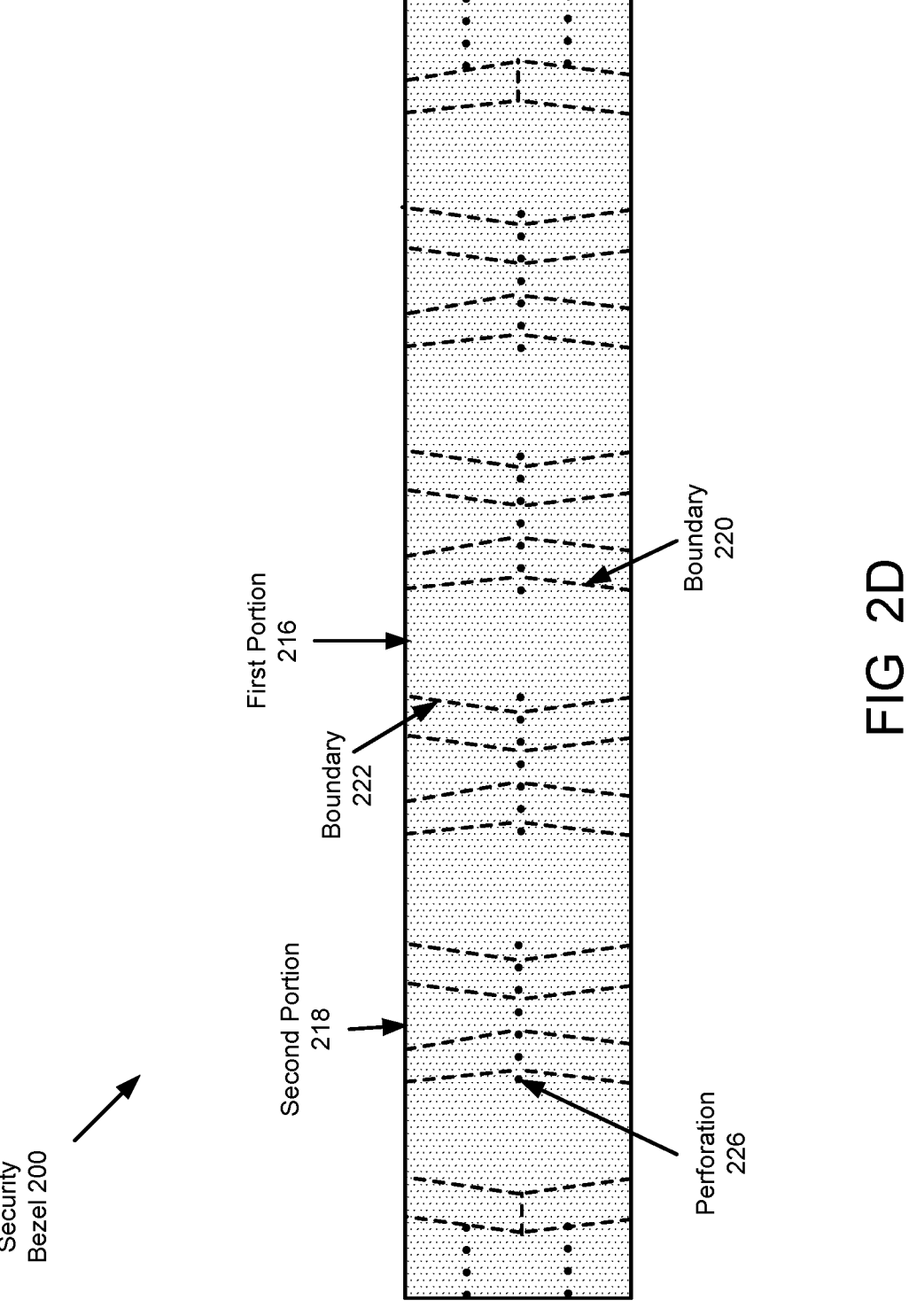
FIGS. 2D-2G show diagrams illustrating fabrication of a security bezel in accordance with an embodiment.

Turning to FIG. 2D, a third diagram illustrating a security bezel (e.g., 200) during an early phase of fabrication in accordance with an embodiment is shown. In FIG. 2D, the viewpoint may be of security bezel 200 in a first phase of fabrication from a front view rather than from an off normal view of the front of the bezel as shown in FIG. 2C.

As noted above, security bezel 200 may be fabricated from a sheet of material. To do so, different structural members may be formed from portions of the sheet of material using non-subtractive processes (discussed further below).

As previously discussed, this sheet of material may (i) be of a homogenous composition, and (ii) have a substantially uniform thickness throughout its entirety. Additionally, the sheet of material may be divided into portions defined by boundaries, the boundaries being edges of the portions on the sheet of material (e.g., at least some of the boundaries may connect the portions with one another).

As used herein, the term divided into portions may mean that a number of sections may be established for a thing such that the sections may be discriminated from one another but may not be removed from the thing. In the context of the security bezel, the sheet of material may be divided into portions corresponding to the structural members of the security bezzle.

These boundaries are depicted in FIG. 2D using dashed lines, dotted lines, and a perimeter of the sheet of material. For example, within the perimeter of the sheet of material (i) a space between two dashed lines (e.g., boundaries 220-222) at the center of the sheet of material may be first portion 216, and (ii) off to the left at another space between another two dashed lines and a dotted line may be second portion 218. First portion 216 and second portion 218 may be the first portion and the second portion used to form structural members 202A-202B, respectively, discussed previously with regard to FIG. 2A.

Due to the homogenous composition and the uniform thickness of the sheet of material, each portion of the portions may also be of the homogenous composition and have a substantially same thickness as the uniform thickness.

To begin forming the structural members using non-subtractive processes, perforations may be made in the sheet of material along some of the boundaries. For example, the boundaries depicted using dotted lines are depicted as such to discriminate the boundaries to be perforated from boundaries not to be perforated (e.g., the dotted lines are to be perforated rather than the dashed lines). For example, a boundary of second portion 218 depicted with a dotted line may be a portion of perforation 226.

Once perforated, each portion of the portions may be defined by four boundaries. For example, a single portion (could be any of the portions such as first portion 216 and/or second portion 218) may be defined by four boundaries. Two of the four boundaries may connect the single portion to other portions of the sheet of material, and a remaining two of the four boundaries may not connect the single portion to any other portions of the sheet of material.

Based on the four boundaries and the perforations, the portions may be manipulated by further using non-subtractive processes to form various types of structural members, thereby fabricating security bezel 200. For additional information regarding the phases of the fabrication, refer to FIG. 2E-2G.

Figure 2E:
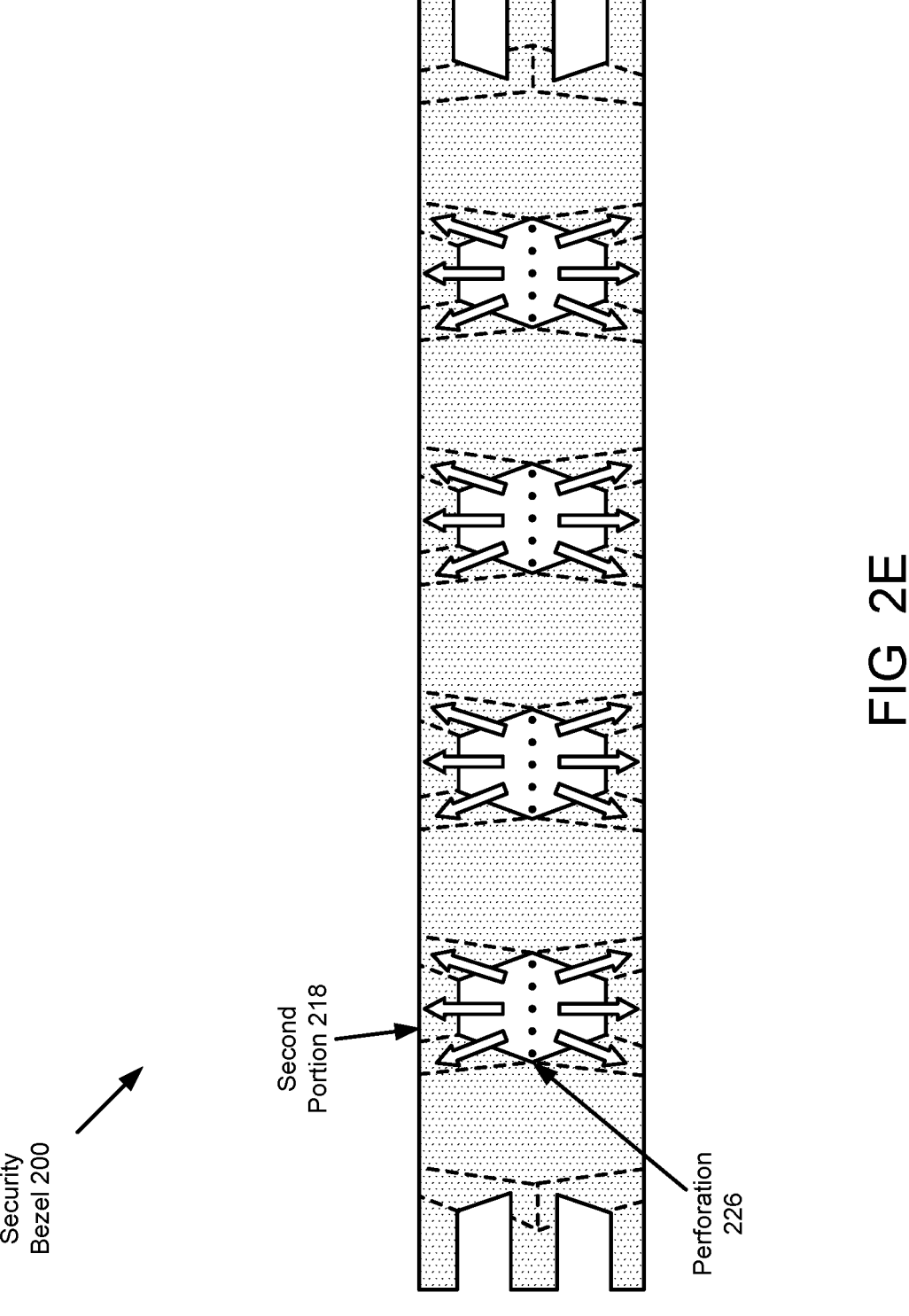

Turning to FIG. 2E, a fourth diagram illustrating a security bezel (e.g., 200) in accordance with an embodiment is shown. In FIG. 2E, the viewpoint may be of security bezel 200 in a second phase of fabrication from the front view as shown in FIG. 2D.

As noted above, the portions may be manipulated using non-subtractive processes to form various types of structural members. To do so, portions with at least one boundary on at least one perforation may be manipulated to expand the perforations to a size (e.g., depicted in FIG. 2E using white arrows) and/or change the orientations of portions of the sheet. For example, second portion 218 may be pushed and/or bent away from perforation 226, thereby expanding perforation 226 and reorienting the pushed and/or bent portions vertically (e.g., into/out of the page). Once expanded to the size, a hole may be formed. This hole formed by manipulating second portion 218 may be a same hole as hole 204B discussed with regard to FIG. 2A.

By expanding these perforations, the portions with at least one boundary on at least one perforation may be formed into structural members of the second type (previously discussed). For example, second portion 218 may be formed into structural member 202B.

To form structural members of the first type (also previously discussed), the sheet of material may be further manipulated using the non-subtractive processes. For additional information regarding the phases of the fabrication, refer to FIG. 2F-2G.

Figure 2F:
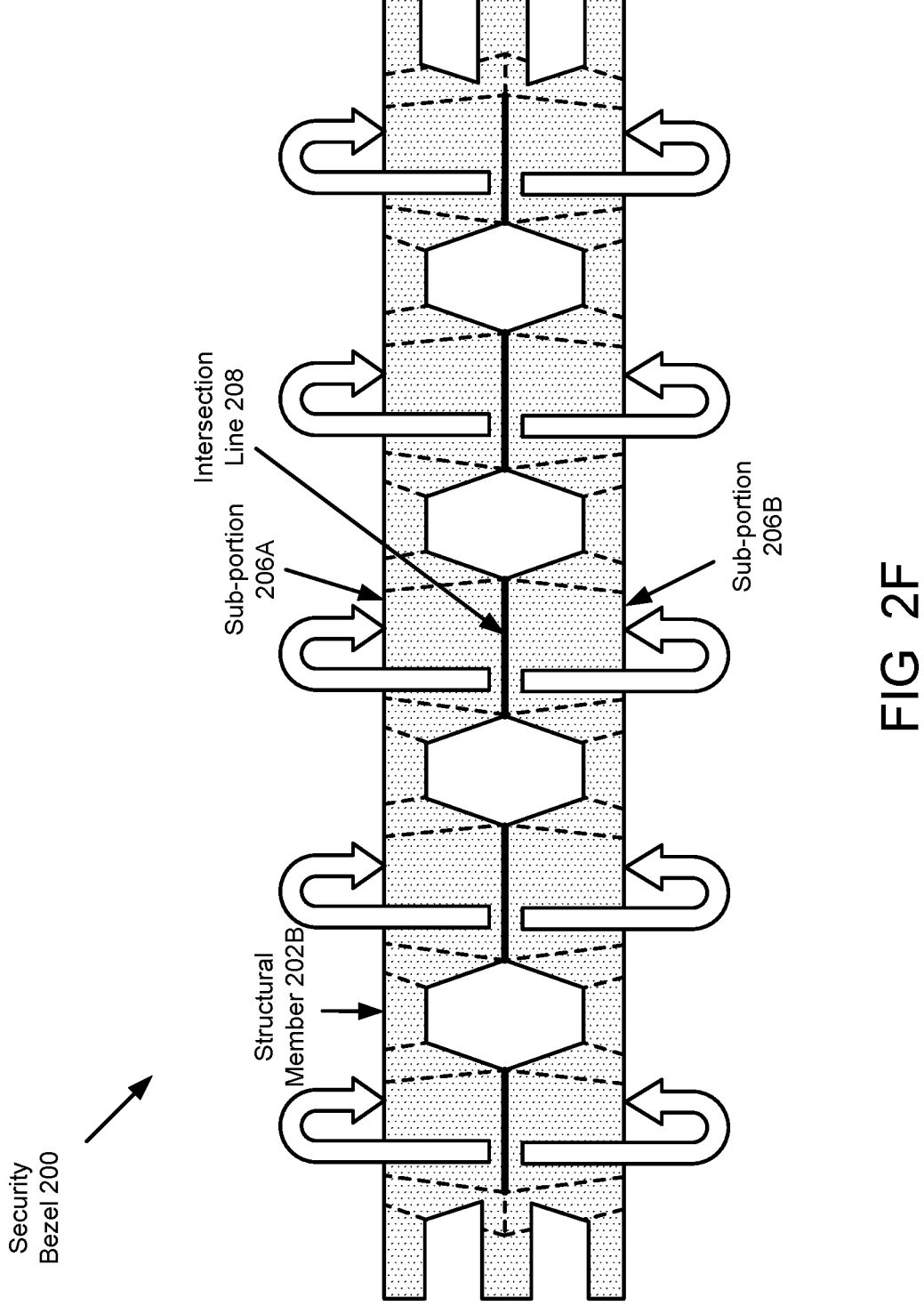

Turning to FIG. 2F, a fifth diagram illustrating a security bezel (e.g., 200) in accordance with an embodiment is shown. In FIG. 2F, the viewpoint may be of security bezel 200 in a third phase of fabrication from the front view as shown in FIGS. 2D-2E. As noted above, the portions may be manipulated using non-subtractive processes to form various types of structural members (e.g., structure members of a first type and/or second type).

To form structural members of the first type, portions in between the perforations (e.g., without a boundary on a perforation) may be divided into sub-portions. In FIG. 2F, a division between these sub-portions is depicted using solid bold lines. For example, first portion 216 may divided into sub-portion 206A and sub-portion 206B by intersection line 208.

Based on the divisions between sub-portions, the sub-portions may be manipulated by folding the sub-portions in a manner as discussed with regard to FIGS. 2A-2B. This non-subtractive process of folding the sub-portions is depicted with white arrows. For example, sub-portions 206A-206B may be folded along intersection line 208.

By manipulating the sub-portions in this way, structural members of the first type may be formed. For example, folding sub-portions 206A-206B may form structural member 202A. For additional information regarding the phases of the fabrication, refer to FIG. 2G.

Figure 2G:
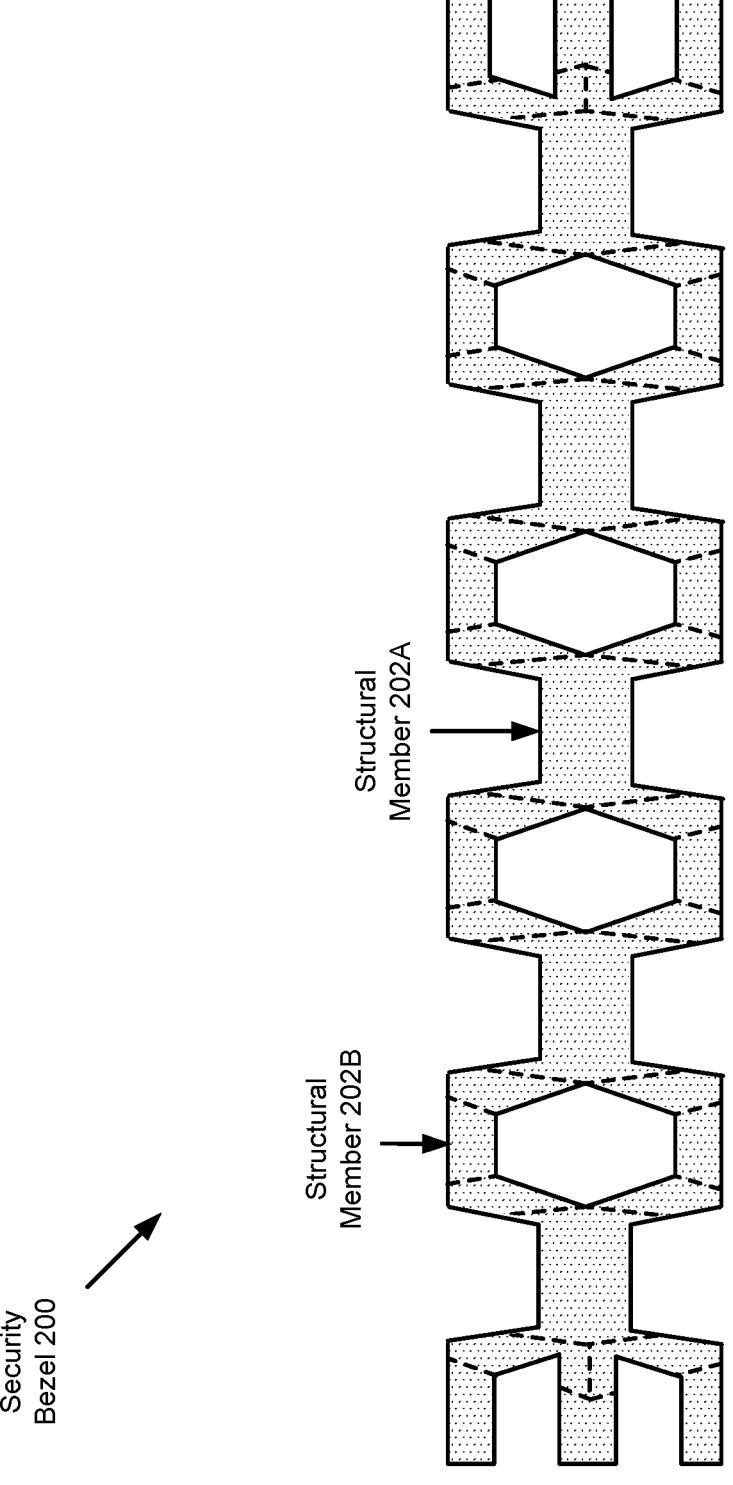

Turning to FIG. 2G, a sixth diagram illustrating a security bezel (e.g., 200) in accordance with an embodiment is shown. In FIG. 2G, the viewpoint may be of security bezel 200 in a fourth phase of fabrication from the front view as shown in FIG. 2G.

As noted above, the portions may be manipulated using non-subtractive processes to form various types of structural members such as structure members of a first type and/or second type (e.g., structural members 202A-202B). By fabricating security bezel 200 to position on an opening in a chassis of a data processing system, access to hardware components of the data processing system may be limited and or prevented entirely. Thus, security bezel 200 may decrease a likelihood of compromise to the data processing system.

Additionally, by using non-subtractive processes to fabricate security bezel 200 from a sheet of material (e.g., sheet metal), the resulting structure may include the structural members and holes, discussed above, that impart physical strength to the security bezel while allowing the traversal of gases through the chassis. By being shaped from the sheet of material, the resulting security bezel (e.g., 200) may be more easily recycled, and less energy intensive to manufacture when compared to manufacturing of other types of structures.

Figure 3:
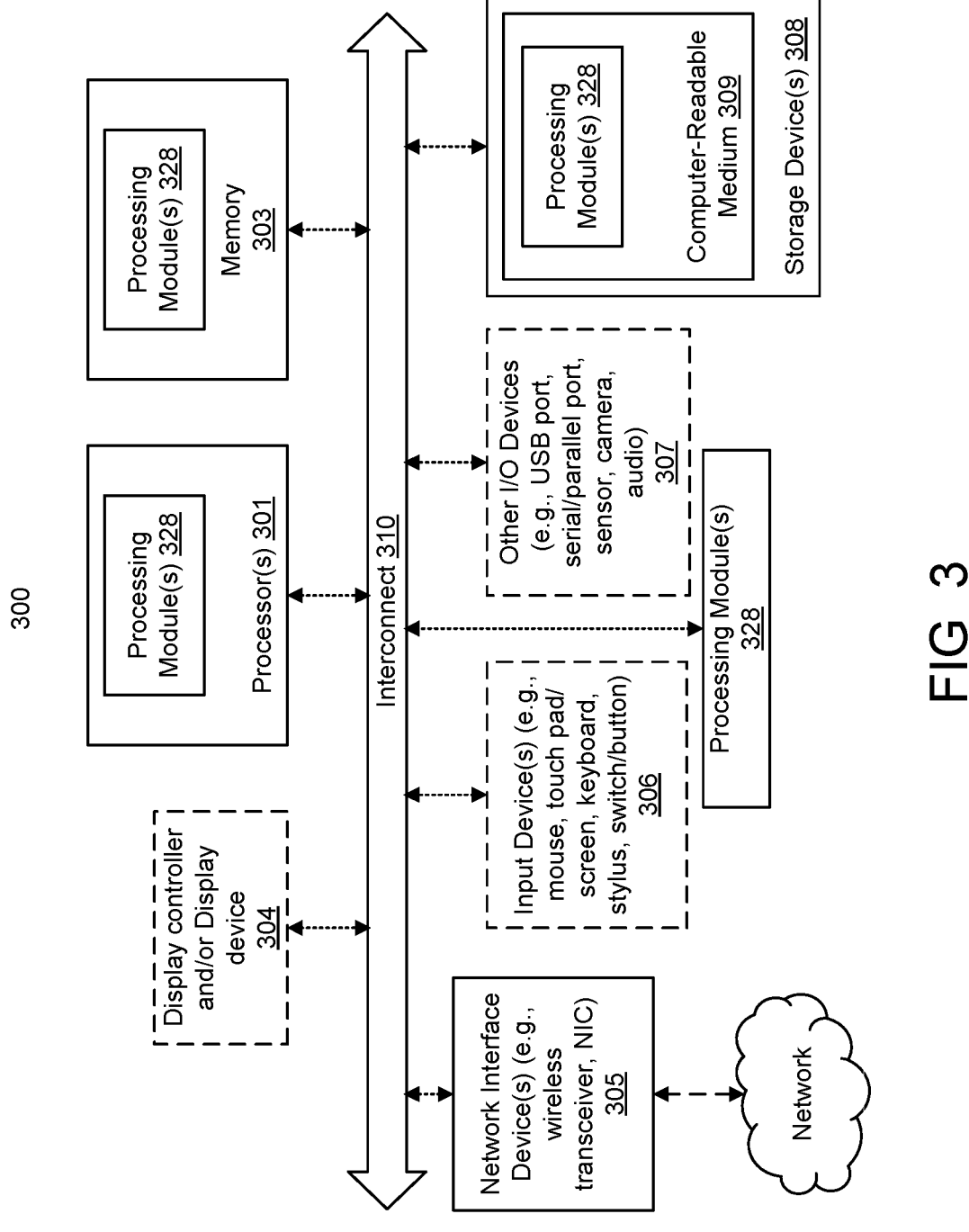
FIG. 3 shows a block diagram illustrating a data processing system in accordance with an embodiment.

Any of the components illustrated in FIGS. 1A-2G may be implemented with and/or used in conjunction with one or more computing devices. For example, the security bezel may be used to secure a chassis in which components of a data processing system may be positioned (e.g., processors, memory, etc.). Turning to FIG. 3, a block diagram illustrating an example of a data processing system (e.g., a computing device) in accordance with an embodiment is shown. For example, system 300 may represent any of data processing systems described above performing any of the processes or methods described above. System 300 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 300 is intended to show a high-level view of many components of the computer system. However, it is to be understood that additional components may be present in certain implementations and furthermore, different arrangement of the components shown may occur in other implementations. System 300 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 300 includes processor 301, memory 303, and devices 305-307 via a bus or an interconnect 310. Processor 301 may represent a single processor or multiple processors with a single processor core or multiple processor cores included therein. Processor 301 may represent one or more general-purpose processors such as a microprocessor, a central processing unit (CPU), or the like. More particularly, processor 301 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 301 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 301, which may be a low power multi-core processor socket such as an ultra-low voltage processor, may act as a main processing unit and central hub for communication with the various components of the system. Such processor can be implemented as a system on chip (SoC). Processor 301 is configured to execute instructions for performing the operations discussed herein. System 300 may further include a graphics interface that communicates with optional graphics subsystem 304, which may include a display controller, a graphics processor, and/or a display device.

Processor 301 may communicate with memory 303, which in one embodiment can be implemented via multiple memory devices to provide for a given amount of system memory. Memory 303 may include one or more volatile storage (or memory) devices such as random-access memory (RAM), dynamic RAM (DRAM), synchronous DRAM (SDRAM), static RAM (SRAM), or other types of storage devices. Memory 303 may store information including sequences of instructions that are executed by processor 301, or any other device. For example, executable code and/or data of a variety of operating systems, device drivers, firmware (e.g., input output basic system or BIOS), and/or applications can be loaded in memory 303 and executed by processor 301. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 300 may further include IO devices such as devices (e.g., 305, 306, 307, 308) including network interface device(s) 305, optional input device(s) 306, and other optional IO device(s) 307. Network interface device(s) 305 may include a wireless transceiver and/or a network interface card (NIC). The wireless transceiver may be a Wi-Fi transceiver, an infrared transceiver, a Bluetooth transceiver, a WiMAX transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 306 may include a mouse, a touch pad, a touch sensitive screen (which may be integrated with a display device of optional graphics subsystem 304), a pointer device such as a stylus, and/or a keyboard (e.g., physical keyboard or a virtual keyboard displayed as part of a touch sensitive screen). For example, input device(s) 306 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 307 may include an audio device. An audio device may include a speaker and/or a microphone to facilitate voice-enabled functions, such as voice recognition, voice replication, digital recording, and/or telephony functions. Other IO devices 307 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 307 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 310 via a sensor hub (not shown), while other devices such as a keyboard or thermal sensor may be controlled by an embedded controller (not shown), dependent upon the specific configuration or design of system 300.

To provide for persistent storage of information such as data, applications, one or more operating systems and so forth, a mass storage (not shown) may also couple to processor 301. In various embodiments, to enable a thinner and lighter system design as well as to improve system responsiveness, this mass storage may be implemented via a solid-state device (SSD). However, in other embodiments, the mass storage may primarily be implemented using a hard disk drive (HDD) with a smaller amount of SSD storage to act as an SSD cache to enable non-volatile storage of context state and other such information during power down events so that a fast power up can occur on re-initiation of system activities. Also, a flash device may be coupled to processor 301, e.g., via a serial peripheral interface (SPI). This flash device may provide for non-volatile storage of system software, including a basic input/output software (BIOS) as well as other firmware of the system.

Storage device 308 may include computer-readable storage medium 309 (also known as a machine-readable storage medium or a computer-readable medium) on which is stored one or more sets of instructions or software (e.g., processing module, unit, and/or processing module/unit/logic 328) embodying any one or more of the methodologies or functions described herein. Processing module/unit/logic 328 may represent any of the components described above. Processing module/unit/logic 328 may also reside, completely or at least partially, within memory 303 and/or within processor 301 during execution thereof by system 300, memory 303 and processor 301 also constituting machine-accessible storage media. Processing module/unit/logic 328 may further be transmitted or received over a network via network interface device(s) 305.

Computer-readable storage medium 309 may also be used to store some software functionalities described above persistently. While computer-readable storage medium 309 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 328, components and other features described herein can be implemented as discrete hardware components or integrated in the functionality of hardware components such as ASICS, FPGAs, DSPs or similar devices. In addition, processing module/unit/logic 328 can be implemented as firmware or functional circuitry within hardware devices. Further, processing module/unit/logic 328 can be implemented in any combination hardware devices and software components.

Note that while system 300 is illustrated with various components of a data processing system, it is not intended to represent any particular architecture or manner of interconnecting the components as such details are not germane to embodiments disclosed herein. It will also be appreciated that network computers, handheld computers, mobile phones, servers, and/or other data processing systems which have fewer components, or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A security bezel for a chassis of a data processing system, the security bezel comprising:

a structure for securing access to an interior of the chassis, the structure comprising:

structural members that form a partial covering for a two-dimensional surface, the structural members comprising a structural member that:

is adapted to:

span a distance between two points on the surface;

resist deformation due to force applied to the structural member; and comprises:

a portion of a sheet of material that is folded so that two sub-portions of the portion of the sheet of material are in different planes that intersect along a line; and holes through the structure, the holes comprising a first hole that:

comprises a first shape; and is at least partially bounded by the structural member where the structural member forms less than a whole of a boundary of the first shape, wherein the holes comprise a second hole that is at least partially bounded by a second structural member of the structural members, wherein the second structural member is a second type of structural member, and the structural member is a first type of structural member, and wherein the second structural member comprises a second portion of the sheet of material that is smaller than the portion of the sheet of material.

2. The security bezel of claim 1, wherein the first hole has a size adapted to prevent intrusion into the interior through the surface.

3. The security bezel of claim 2, wherein the size is further adapted to facilitate movement of objects below a size threshold through the surface.

4. The security bezel of claim 1, wherein at least a portion of the holes are arranged in a honeycomb pattern.

5. The security bezel of claim 1, wherein the second portion of the sheet of material and a first sub-portion of the portion of the sheet of material are substantially a same size.

6. The security bezel of claim 1, wherein the sheet of material is sheet metal.

7. The security bezel of claim 6, wherein the portion of the sheet of material is defined by four boundaries, two of the four boundaries connect the portion of the sheet of material to other portions of the sheet of material, and a remaining two of the four boundaries are unconnected to any portions of the sheet of material.

8. The security bezel of claim 1, wherein the structural members comprise a second structural member that also partially bounds the first hole, and the second structural member comprises a second portion of the sheet of material that is smaller than the portion of the sheet of material.

9. The security bezel of claim 1, wherein the sheet of material is monolithic and comprises all of the structural members.

10. An enclosure comprising:

a chassis; and a security bezel comprising:

a structure for securing access to an interior of the chassis, the structure comprising:

structural members that form a partial covering for a two-dimensional surface, the structural members comprising a structural member that:

is adapted to:

span a distance between two points on the surface;

resist deformation due to force applied to the structural member; and comprises:

a portion of a sheet of material that is folded so that two sub-portions of the portion of the sheet of material are in different planes that intersect along a line; and holes through the structure, the holes comprising a first hole that:

comprises a first shape; and is at least partially bounded by the structural member where the structural member forms less than a whole of a boundary of the first shape, wherein the holes comprise a second hole that is at least partially bounded by a second structural member of the structural members, wherein the second structural member is a second type of structural member, and the structural member is a first type of structural member, and wherein the second structural member comprises a second portion of the sheet of material that is smaller than the portion of the sheet of material.

11. The enclosure of claim 10, wherein the first hole has a size adapted to prevent intrusion into the interior through the surface.

12. The enclosure of claim 11, wherein the size is further adapted to facilitate movement of objects below a size threshold through the surface.

13. The enclosure of claim 10, wherein at least a portion of the holes are arranged in a honeycomb pattern.

14. The enclosure of claim 10, wherein the second portion of the sheet of material and a first sub-portion of the portion of the sheet of material are substantially a same size.

15. The enclosure of claim 10, wherein the sheet of material is sheet metal.

16. A data processing system comprising:

a chassis;

hardware components positioned in the chassis; and a security bezel comprising:

a structure for securing access to an interior of the chassis, the structure comprising:

structural members that form a partial covering for a two-dimensional surface, the structural members comprising a structural member that:

is adapted to:

span a distance between two points on the surface;

resist deformation due to force applied to the structural member; and comprises:

a portion of a sheet of material that is folded so that two sub-portions of the portion of the sheet of material are in different planes that intersect along a line; and holes through the structure, the holes comprising a first hole that:

comprises a first shape; and is at least partially bounded by the structural member where the structural member forms less than a whole of a boundary of the first shape, wherein the holes comprise a second hole that is at least partially bounded by a second structural member of the structural members, wherein the second structural member is a second type of structural member, and the structural member is a first type of structural member, and wherein the second structural member comprises a second portion of the sheet of material that is smaller than the portion of the sheet of material.

17. The data processing system of claim 16, wherein the first hole has a size adapted to prevent intrusion into the interior through the surface.

18. The data processing system of claim 17, wherein the size is further adapted to facilitate movement of objects below a size threshold through the surface.

19. The data processing system of claim 16, wherein at least a portion of the holes are arranged in a honeycomb pattern.

20. The data processing system of claim 16, wherein the second portion of the sheet of material and a first sub-portion of the portion of the sheet of material are substantially a same size.

* * * * *